United States Patent [19]
Beeken et al.

[11] Patent Number: 4,730,167
[45] Date of Patent: Mar. 8, 1988

[54] POWER SUPPLY ARRANGEMENT

[75] Inventors: Horst Beeken; Hans-Heinrich Vitters, both of Berlin, Fed. Rep. of Germany

[73] Assignee: Licentia Patent-Verwaltungs-GmbH, Frankfurt am Main, Fed. Rep. of Germany

[21] Appl. No.: 889,085

[22] Filed: Jul. 24, 1986

[30] Foreign Application Priority Data

Jul. 25, 1985 [DE] Fed. Rep. of Germany ....... 3526548
Oct. 1, 1985 [DE] Fed. Rep. of Germany ....... 3534979

[51] Int. Cl.⁴ ............................................... H03F 3/38
[52] U.S. Cl. ........................................ 330/10; 330/297
[58] Field of Search ............................ 330/9, 10, 297

[56] References Cited
U.S. PATENT DOCUMENTS 4,153,882 5/1979 Fisher ..................................... 330/10
4,403,197 9/1983 Swanson ............................... 330/10

FOREIGN PATENT DOCUMENTS 0066904 4/1982 European Pat. Off. .
0124765 5/1983 European Pat. Off. .
1284986 11/1971 Fed. Rep. of Germany .
89105 7/1981 Japan ................................. 330/297

Primary Examiner—Gene Wan
Attorney, Agent, or Firm—Spencer & Frank

[57] ABSTRACT

A power supply arrangement for amplifying a modulated voltage signal. A switch control device is programed with a switching schedule for switching a plurality of individual power supply units in dependence on the magnitude of the modulated voltage signals to result in an essentially uniform electrical load on the power transformer, with the internal resistance of the transformer being essentially independent of the number of switched-on individual power supply units.

12 Claims, 7 Drawing Figures

POWER SUPPLY ARRANGEMENT

BACKGROUND OF THE INVENTION

The present invention relates to a power supply arrangement, and particularly to such an arrangement for generating a modulated voltage for the anode of the final stage of a power transmitter.

A high frequency power transmitter which has an output power of, for example, 500 kW and a high frequency final stage tube with a modulated anode voltage must be supplied with an anode voltage of approximately 30 kV that has been amplitude modulated with a low frequency (LF) signal. It is desirable that such a power transmitter has the best possible efficiency.

Switching amplifiers are known which sum a plurality of switchable direct voltage signals along a diode cascade so that a desired high output voltage is produced. If the individual direct voltage signals are switched in dependence on the magnitude of an LF signal, the high voltage output signal approximates the LF signal amplified by a desired amount. Such a switching amplifier includes a power transformer which has at least one primary winding and a plurality of secondary windings that are not electrically connected with one another. Such a configuration produces so-called floating direct voltage sources on the secondary side which generate essentially identical output voltages which are then summed as discussed above.

Such a summation is illustrated diagramatically in FIG. 1 which shows voltage U as a function of time t. The curve marked $U_A$ represents the amplitude modulated anode voltage to be produced. This voltage is approximately produced by the exemplary summation of the individual direct voltages $U_1$ to $U_5$ which are essentially equal in magnitude.

The voltage summation according to FIG. 1 is disadvantageous because it results in very unequal load times for the individual direct voltage sources. For example, the direct voltage source belonging to the individual direct voltage $U_1$ must be switched on at time $t_1$ and switched off at time $t_{10}$, while the direct voltage source belonging to individual direct voltage $U_5$ is not switched on until time $t_5$, which is significantly later and is switched off at time $t_6$ which is significantly earlier. In this example, the direct voltage source belonging to individual direct voltage $U_1$ is under load approximately twice as long as the direct voltage source belonging to individual direct voltage $U_5$.

It is of course possible to construct the individual direct voltage sources in such a manner that they are adapted to the differences in load. However, such an adaptation is uneconomical in industrial mass production and thus clearly a disadvantage.

To avoid this drawback, the direct voltage sources can all be designed to accommodate the greatest possible load. Such a structure, however, is also uneconomical to produce.

It is further desirable to keep the magnitude of the individual direct voltages as low as possible in order to minimize the step structure shown in FIG. 1 and thus to realize a modulated anode voltage which has relatively low distortion.

European Patent Application No. 0,124,765 discloses a monitoring device which monitors the operating parameter values of individual, series-connected power supply units and feeds these values, with the aid of a feedback loop, to a computer or actuation unit which then makes the decision as to which power supply unit is to be switched on, and when and for how long. The purpose of this device is to keep the loads on all power supply units as uniform as possible so as to minimize the loads on these units.

The drawback here is that the calculations performed for the selection of the individual power supply units considers only the optimum loads and not the electrical geometry of the transformer employed. Moreover, this implementation also involves considerable expenditures to measure the operating parameters for each power supply unit and to make a decision as to which individual power supply unit is to be switched.

SUMMARY OF THE INVENTION

It is therefore an object of the present invention to provide a power supply arrangement of the above type so that it is possible, in particular, to generate an amplitude modulated anode voltage with low distortion for a high frequency high power transmitter, taking into consideration the electrical characteristics of the power transformer as well as the individual power supply units and to provide, in particular, a substantially constant internal resistance, with such a power supply arrangement being economical to produce, particularly in industrial mass production.

The foregoing and other objects are accomplished according to the invention by the provision of a power supply arrangement for amplifying a modulated voltage signal, including:

a power transformer composed of a primary winding, and a plurality of individual power supply units each having a secondary winding arranged in operative relationship with the primary winding and including means connected to the secondary winding for generating a direct voltage in response to an alternating voltage impressed across the primary winding, each power supply unit further including a controllable switch for switching the power supply unit on and off independently of the other power supply units so that the direct voltage from selected power supply units can be additively combined; and switch control means coupled to the modulated voltage signal and having a plurality of outputs each connected to a respective one of the controllable switches, the switch control means including a permanently programed control means which stores a program comprising a switching schedule for selectively controlling the controllable switches in dependence of the momentary value of the amplitude of the modulated voltage signal and in a manner which takes into consideration the electrical characteristics of the individual power supply units to maintain a uniform load on the transformer and to provide a substantially constant internal resistance for the individual power supply units. According to a further aspect of the invention the switch control means switches on selected ones of the individual power supply units in succession in response to an increasing value of the magnitude of the modulated voltage signal, and, in response to a decreasing value of the magnitude of the modulated voltage signal, the switch control means switches off selected ones of the individual power supply units in succession in the reverse order in which such individual power supply units were switched on.

An advantage of the invention results from the fact that, during a given time interval, all individual power supply units are switched according to a fixed, given switching scheme so that the required power transformer is essentially under uniform load. A computer or a monitoring unit with feedback loop, respectively, is thus not necessary. In this way it is accomplished that all individual power supply units have essentially the same internal electrical resistance. Each individual power supply unit thus produces an essentially independent direct output voltage. A summation of a plurality of such direct output voltages makes it possible, in particular, to produce the above-mentioned modulated high output voltage signal with a low distortion factor.

DESCRIPTION OF THE PREFERRED EMBODIMENTS

The invention is based on the surprising realization that it is possible, in a power supply transformer having a plurality of secondary windings wound in chambers, to switch one group of secondary windings in such a manner that the electrical characteristics of the power transformer remain essentially constant. In this way, the internal resistances of the individual power supply units produced by means of the secondary windings also remain essentially constant.

Figure 1:
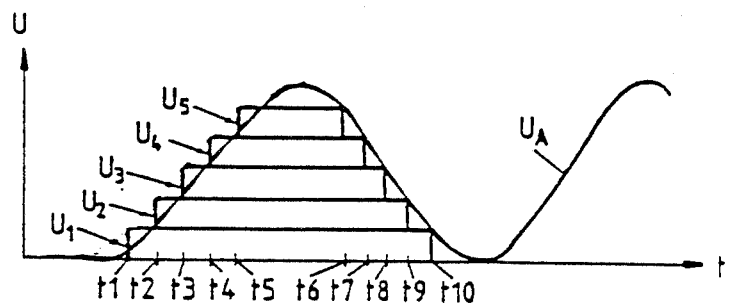
FIG. 1 is a signal diagram illustrating the operation of a prior art voltages produced by a power supply transformer.
Figure 2A:
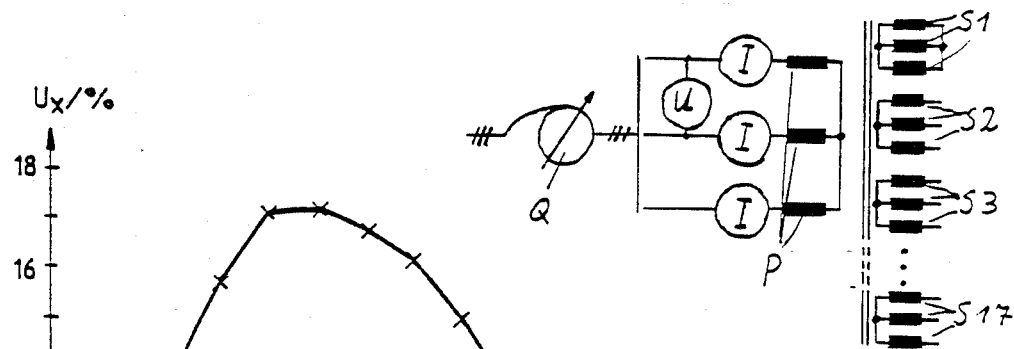
FIG. 2A illustrates a simplified circuit schematic of a power supply transformer used to explain the operation of the invention.
Figure 2B:
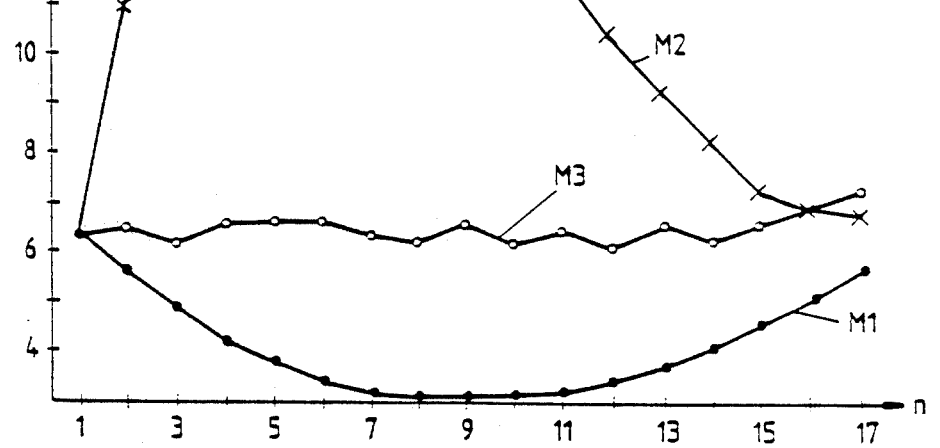
FIG. 2B is a signal diagram employed illustrating various modes of operation of the circuit of FIG. 2A.

This behavior of a power transformer will be explained below with reference to FIGS. 2A and 2B. FIG. 2A shows an exemplary 3-phase power transformer in Yy . . . - configuration having a primary winding P and seventeen secondary windings S1 to S17 arranged in juxtaposed chambers and numbered consecutively beginning at one end. The primary winding is connected to a controllable alternating voltage source Q. FIG. 2B illustrates exemplary curves which result when the reactive component $U_x$ of the rated voltage on the primary side is measured at one, or a plurality of, short-circuited secondary windings. In the example according to FIG. 2A, only the 3-phase secondary winding S1 is short-circuited.

In FIG. 2B, the reactive component of voltage $U_x$ is plotted on the ordinate in percent with reference to the alternating voltage measured on the primary side. The real component of voltage $U_R$ is negligible for large transformers.

For the curve M1 only a single one of the secondary windings S1 to S17 is short-circuited, the number of such short-circuited winding being determined by the number n plotted on the abscissa. Thus, for example, if secondary winding S1 is short-circuited, the reactive component $U_x$ is about 3% greater than for the short-circuited secondary winding S8.

Curves M2 and M3 represent the percentage of reactive component $U_x$ for the case where a plurality of secondary windings are short-circuited simultaneously. The number n plotted on the abscissa indicates the number of short-circuited secondary windings. For curve M2, all secondary windings beginning with secondary winding S1 (n=1) are short-circuited in succession and the percentage of the reactive component $U_x$ is measured in each case. For example, at n=7, secondary windings S1 to S7 are short-circuited and at n=17 secondary windings S1 to S17 are short-circuited. For this curve M2, the reactive component $U_x$ changes considerably from approximately 6% to approximately 17%.

For curve M3, the number n also indicates the number of short-circuited secondary windings. However, these windings are short-circuited according to a special schedule which depends on the curve M2 and the related switching scheme according to FIG. 2C. For example, for n=1, only secondary winding S1 is short-circuited. For n=4, for example, secondary windings S1, S10, S2 and S11 are short-circuited. Curve M3 indicates that this measure considerably reduces the fluctuation of the percentage of the reactive component $U_x$.

Figures 2C, 3:
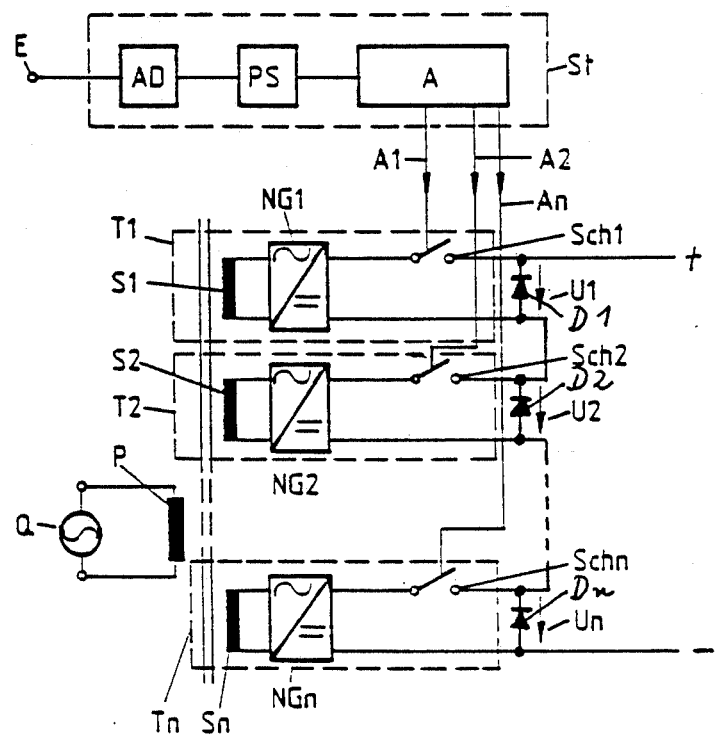
FIG. 2C illustrates an experimentally determined switching scheme of the secondary windings of a transformer according to FIG. 2A.
FIG. 3 is a circuit schematic in partial block circuit form illustrating a power transformer according to the invention.

FIG. 3 shows an embodiment of, for example, 50 power supply units Tn (n=50). In this embodiment of a power supply arrangement unit, the direct voltage can be switched in stages up to approximately 30 kV at approximately 40 A, with each stage being approximately 600 V. The schematically illustrated power supply arrangement is composed of a power transformer having a primary winding P designed, for example, for a power supply producing alternating voltage of 380 V and 50 Hz. This power transformer has, for example, n secondary windings S1 to Sn, where, for example, n=50, with each winding being a component of an associated individual power supply unit T1 to Tn.

Each individual power supply unit T1 to Tn includes, for the alternating voltages generated in secondary windings S1 to Sn, customary rectification devices NG1 to NGn. The resulting direct voltages U1 to Un are each about 600 V and are essentially the same, that means, all secondary windings of the transformer and all power supply units T1 to Tn are designed equally. The resulting output voltages of the power supply units are, however, a little bit different from each other. This results from different inductive voltage drops in the transformer resulting from stray flux and differences according to load operation or no-load operation. The voltages U1 to Un are switched by switches Sch1 to Schn which are preferably semiconductor switches. These switches are actuated by a switching unit St, which is composed, for example, of an analog/digital converter AD, a permanently programed control unit PS and an output unit A whose outputs A1 to An are connected with switches Sch1 to Schn for actuating such switches. The electrical input E of the switching unit is connected with a direct voltage coupled modulation signal, e.g. an LF signal having a bandwidth of about 7.5 KHz. Switching unit St is configured so that a number of individual power supply units corresponding to the momentary value of the amplitude of the modulation signal is switched on by the corresponding switches under consideration of a measured switching schedule according to a curve corresponding to curve M3 (FIG. 2B).

The switching schedule is stored as a fixed program in programmable control unit PS, e.g. in a programmable read-only memory (PROM). For example, if the momentary value of the amplitude of the modulation signal is low, individual power supply unit T1 is initially switched on. If the momentary value increases steadily, for example, individual power supply units T26, T2 and T27 are switched on in succession. According to FIG. 3 it is now possible to add the output voltages U1 to $U_n$ of 50 power supply units T1 to Tn which have almost equal electrical ratings as those described according to FIG. 2B. The addition of the output voltages U1 to Un is done by a cascade connection of diodes D1 to Dn. If the momentary value reaches its maximum a total of, for example, 48 individual power supply units are switched on, with their sequence being fixed by the stored switching schedule. If the momentary value drops, the individual power supply units which were switched on first are switched off first, i.e. first T1, then T26, then T2, then T27 and so on.

Figure 4A:
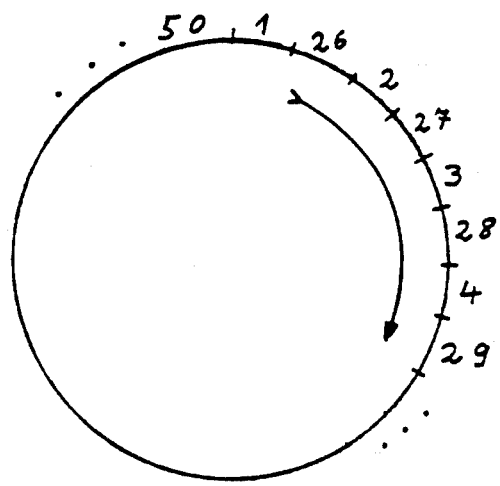
FIGS. 4A and 4B illustrate the relationship of the amplitude of the output voltage to the numbers of switched-on power supply units.

According to FIG. 4A, the foregoing arrangement can also be explained in that the number of individual power supply units corresponding to the momentary value are combined in a sector of variable length which rotates within an annularly arranged total number of individual power supply units (switching ring) at a rotation frequency which is substantially less than the frequency of the modulation signal. This type of switching advantageously results in a uniform electrical load on the power transformer. It also results in nearly the same internal electrical resistance in all individual power supply units so that their switching does not produce additional distortion during, for example, a subsequent summation of the output voltages of the individual power supply units. FIG. 4A shows such an arrangement in which the power supply units T1 to Tn (n=50) are connected to a switching ring beginning at number 1 and ending at number 50. These numbers represent the power supply units T1 to Tn. The succession of switching is determined according to a scheme similar to that one described in FIG. 2B (curve M3). As described before, first power unit 1 is switched on. Then, if the momentary value of the amplitude of the LF-signal rises, the additional power units 26, 2, 27 etc. are switched on at the tip of the curved arrow. If now the momentary value decreases, first the power units at the end of the arrow are switched off, e.g. first unit 1 and then unit 26. If now the momentary value rises again, other power units are switched on at the tip of the curved arrow, e.g. units 3 and 28, and so on. In this way, the curved arrow represents a sector of variable length which rotates clockwise within the switching ring at a rotation frequency which is much lower than the modulation frequency. In this way, it is achievable that the transformer is always nearly loaded equally, so that the aforementioned disadvantages are avoided and all power units produce almost the same output voltages.

Figure 4B:
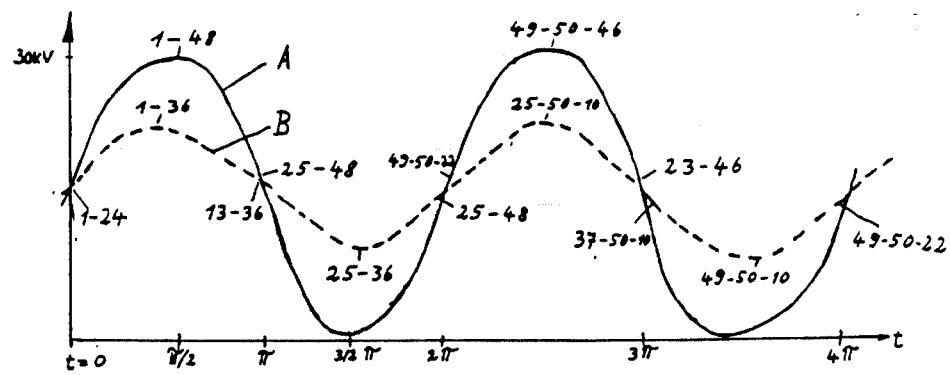

According to FIG. 4B, it is, for example, necessary to switch on only 48 power units to produce peak power of a trnasmitter. The remaining two power units represent a reserve for failure of a power unit or for compensating mains fluctuations. Curve A represents a time dependent modulation voltage according to full modulation. At time t=0 only 24 power supply units are switched on. With increasing voltage additional power supply units are switched on until the maximum number of 48 is reached at time $t=\pi/2$. A decreasing voltage causes a gradual switch-off of the firstly switched-on 24 power supply units at time $t=\pi$ and so on. Thus at full modulation the sector (curved arrow) in FIG. 4A has a maximum length of 48 and its rotation frequency is 2/50 of that of the modulation frequency (frequency of the LF-signal).

Curve B in FIG. 4B denotes a modulation voltage for half modulation. The maximum length of the sector is 36 and the resulting rotation frequency is 26/50 of that of the modulation frequency.

A high frequency transmitter, in particular, has an operating mode in which no modulation signal, e.g. an LF signal, is present. In such a case, however, a certain voltage should be present at the output of the power supply unit, which voltage should correspond to a setting for transmission of the unmodulated carrier frequency. For this mode of operation, it is necessary to program the programmable control unit PS so that only a certain number of individual power supply units, i.e. 24, are switched on at any one time.

These individual power supply units are combined into a sector which rotates within the switching ring at a fixedly programed frequency of, for example, 200 Hz, so that here again the individual power supply units and the power transformer are under uniform loads. In this operating mode, only 24 power supply units are switched on, confer FIG. 4B at time t=0. This is about half of all power supply units (n=50). For achieving equal output voltages of all switched-on power supply units, the changes of load during that rotation process have to occur at a frequency that is much greater than the electrical filter chain resonance frequency of a single power supply unit. This filter chain resonance frequency, e.g. 27 Hz, is much lower than the frequency, e.g. 50 Hz, of the mains. Therefore, the corresponding fixedly programmed frequency of rotation of the corresponding sector of those 24 power supply units has to be much greater than 2×27 Hz. This fixedly programmed frequency of rotation is therefore choosen to be, e.g., 200 Hz. A similarly enforced rotation is produced if the modulation signal is a direct voltage signal. If one or a plurality of individual power supply units are malfunctioning, the switching ring is correspondingly reduced in size depending on a new curve, called for example M3' and a new switching scheme according to FIG. 2C, with the aid of the programmable control unit so that again optimum load conditions are produced.

The present invention is not limited to the illustrated embodiment but can be used in the same sense for other embodiments. For example, it is possible to replace the mentioned single power transformer by a plurality of such power transformers whose individual power supply units are then switched in the described manner. Moreover, it is possible, for example, to replace switching unit St by other electronic logic components which are linked together in such a manner that the above-mentioned switching becomes possible.

If, for example, a highly stable, unmodulated carrier signal is to be transmitted, it is advisable to have the control unit PS switch on only those individual power supply units which are required to generate the necessary direct voltage. The individual power supply units are here selected by the control unit PS in the described manner so that the optimum load on the transformer is realized. Under normal operating conditions, i.e. if no malfunction is present, the individual power supply units are not switched so as to avoid even slight fluctuations in the amplitude of the carrier as they are possibly produced by the switching process.

It will be understood that the above description of the present invention is susceptible to various modifications, changes and adaptations, and the same are intended to be comprehended within the meaning and range of equivalents of the appended claims.

What is claimed is:

1. A power supply arrangement for amplifying a modulated voltage signal comprising:
a power transformer composed of a primary winding, and a plurality of individual power supply units each having a secondary winding arranged in operative relationship with said primary winding, and including means connected to said secondary winding for generating a direct voltage from a voltage induced across said secondary winding in response to an alternating voltage impressed across said primary winding, each individual power supply unit further including a controllable switch for switching said individual power supply unit on and off independently of the other individual power supply units so that the direct voltage from selected individual power supply units can be additively combined to form an amplified modulated voltage signal; and
switch control means coupled to the modulated voltage signal and having a plurality of outputs each connected to a respective one of said controllable switches, said switch control means including a permanently programmed control means which stores a program comprising a switching schedule for selectively controlling the controllable switches in dependence of the momentary value of the amplitude of the modulated voltage signal and in a manner which combines said individual power supply units into an annular arrangement to form a switching ring in which adjacent individual power supply units are combined solely in dependence of their electrical characteristics so that, during switching of identically sized sectors in the switching ring, voltage jumps are produced which are essentially of the same magnitude and said individual power supply units have essentially the same internal resistances, said switching schedule causing additional individual power supply units to be switched in consecutively at the beginning of a sector in response to an increase in the momentary value of magnitude of the modulated voltage signal and causing individual power supply units to be consecutively switched off at the end of a sector in response to a reduction in the momentary value of the magnitude of the modulated voltage signal.

2. Power supply arrangement as defined in claim 1, wherein said switch control means is programed so that said individual power supply units within the switching ring are switched in cyclical rotation.

3. Power supply unit arrangement as defined in claim 1, wherein when a high frequency carrier signal containing no modulation voltage is coupled to said switch control means, said switch control means selects a fixed sector within said switching ring which contains a sufficient number of individual power supply units to assure transmission of the high frequency carrier signal, and said switch control means causes said fixed sector to periodically rotate within said switching ring so that said transformer and said individual power supply units are essentially under uniform load.

4. Power supply arrangement as defined in claim 3, wherein said switch control means generates a switching frequency to rotate said fixed sector, said switching frequency being higher than a filter chain resonance frequency employed in an individual power supply unit.

5. Power supply arrangement as defined in claim 1, wherein said switching ring contains at least one more individual power supply unit than is required for generating the maximum voltage in a sector so that it is possible for said sector to rotate within said switching ring if it is fully driven.

6. Power supply arrangement as defined in claim 1, wherein said controllable switches are comprised of semiconductor switches.

7. Power supply arrangement as defined in claim 1, wherein said programmable control means includes a programmable read-only memory in which the sequence of the individual power supply units to be switched is programmed according to measured electrical characteristics of said power transformer.

8. Power supply arrangement as defined in claim 1, wherein said switching schedule is configured so that, upon a malfunction of one or a plurality of individual power supply units, the remaining operational individual power supply units are combined into a switching ring of reduced size which permits optimum load conditions, allowing said power supply arrangement to continue operation without interruption.

9. Power supply arrangement as defined in claim 1, wherein said switching schedule is configured so that, with a modulation voltage signal in the form of a direct voltage, an associated rotating sector is formed in said switching ring.

10. Power supply arrangement as defined in claim 1, wherein said switching schedule is configured so that, for amplification of an unmodulated voltage carrier signal, only those individual power supply units are switched on which are required to produce the necessary direct voltage so that, under normal operating conditions, re-switching of the individual power supply units is avoided and the position of the individual power supply units is selected in such a manner that the transformer is under optimum load.

11. A power supply arrangement for amplifying a modulated voltage signal comprising:
a power transformer composed of a primary winding and a plurality of individual power supply units each having a secondary winding arranged in operative relationship with said primary winding, and including means connected to said secondary winding for generating a direct voltage from a voltage induced across said secondary winding in response to an alternating voltage impressed across said primary winding, each individual power supply unit further including a controllable switch for switching said individual power supply unit on and off independently of the other individual power supply units so that the direct voltage from selected individual power supply units can be additively combined to form an amplified modulated voltage signal; and
switch control means coupled to the modulated voltage signal and having a plurality of outputs each connected to a respective one of said controllable switches, said switch control means including a permanently programmed control means which stores a program comprising a switching schedule for selectively controlling the controllable switches in dependence of the momentary value of the amplitude of the modulated voltage signal and in a manner which takes into consideration the electrical characteristics of said individual power supply units to maintain a uniform load on said transformer and to provide a substantially constant internal resistance for said transformer, independent of the number of said power supply units switched on.

12. A power supply arrangement as defined in claim 11, wherein said switch control means switches on selected ones of said individual power supply units in succession in response to an increasing value of the magnitude of said modulated voltage signal, and in response to a decreasing value of the magnitude of the modulated voltage signal, said switch control means switches off selected ones of said individual power supply units in succession in the reverse order in which such individual power supply units were switched on.

* * * * *